(12) United States Patent
Sung

(10) Patent No.: US 7,951,642 B2
(45) Date of Patent: May 31, 2011

(54) DIAMOND-LIKE CARBON ELECTRONIC DEVICES AND METHODS OF MANUFACTURE

(76) Inventor: Chien-Min Sung, Tansui (TW)

( * ) Notice: Subject to any disclaimer, the term of this patent is extended or adjusted under 35 U.S.C. 154(b) by 0 days.

(21) Appl. No.: 12/826,502

(22) Filed: Jun. 29, 2010

(65) Prior Publication Data

US 2010/0330739 A1    Dec. 30, 2010

Related U.S. Application Data

(62) Division of application No. 11/893,589, filed on Aug. 14, 2007, now Pat. No. 7,745,831.

(60) Provisional application No. 60/837,885, filed on Aug. 14, 2006.

(51) Int. Cl.
*H01L 31/0312* (2006.01)
*H01L 21/00* (2006.01)
*H01L 31/00* (2006.01)

(52) U.S. Cl. ............................ 438/105; 257/77; 136/252

(58) Field of Classification Search .................. 438/105; 257/77; 136/243, 252, 261
See application file for complete search history.

(56) References Cited

U.S. PATENT DOCUMENTS

| | | | |
|---|---|---|---|
| 4,571,447 A | 2/1986 | Prins | |
| 4,999,308 A | 3/1991 | Nishiura et al. | |
| 5,212,385 A | 5/1993 | Jones | |
| 5,273,788 A | 12/1993 | Yu | |
| 5,360,491 A | 11/1994 | Carey et al. | |
| 5,677,236 A | 10/1997 | Saitoh et al. | |
| 6,423,193 B1 | 7/2002 | Miller et al. | |
| 6,793,979 B2 | 9/2004 | Veerasamy | |
| 6,924,164 B2 | 8/2005 | Jenson | |
| 7,083,873 B2 | 8/2006 | Hayashi | |
| 2004/0201346 A1 | 10/2004 | Pai | |
| 2005/0092357 A1 | 5/2005 | Dang | |
| 2005/0151464 A1 | 7/2005 | Sung | |
| 2005/0168122 A1 | 8/2005 | Dahl | |
| 2006/0125369 A1 | 6/2006 | Chen | |

(Continued)

FOREIGN PATENT DOCUMENTS

JP        64-077973        3/1989

(Continued)

OTHER PUBLICATIONS

M. Alaluf et al., Amorphous diamond-like carbon films—a hard anti-reflecting coating for silicon solar cells,Thin Solid Films 256 (1995)1-3.

(Continued)

*Primary Examiner* — Kiesha R Bryant
*Assistant Examiner* — Mark W Tornow
(74) *Attorney, Agent, or Firm* — Thorpe North & Western LLP

(57) ABSTRACT

Materials, devices, and methods for enhancing performance of electronic devices such as solar cells, fuels cells, LEDs, thermoelectric conversion devices, and other electronic devices are disclosed and described. A diamond-like carbon electronic device can include a conductive diamond-like carbon cathode having specified carbon, hydrogen and $sp^2$ bonded carbon contents. In some cases, the $sp^2$ bonded carbon content may be sufficient to provide the conductive diamond-like carbon material with a visible light transmissivity of greater than about 0.70. A charge carrier separation layer can be coupled adjacent and between the diamond-like carbon cathode and an anode. The conductive diamond-like carbon material of the present invention can be useful for any other application which can benefit from the use of conductive and transparent electrodes which are also chemically inert, radiation damage resistance, and are simple to manufacture.

10 Claims, 2 Drawing Sheets

U.S. PATENT DOCUMENTS

2007/0001581 A1  1/2007  Stasiak et al.

FOREIGN PATENT DOCUMENTS

| JP | 1303763 | 12/1989 |
| JP | 2034975 | 2/1990 |
| JP | 05-243597 | 9/1993 |
| JP | 9097919 | 4/1997 |
| JP | 01-127315 | 5/2001 |
| JP | 05-293863 | 10/2005 |

OTHER PUBLICATIONS

F.J. Pern, Diamond-like Carbon Coatings as Encapsulants for Photovoltaic Solar Cells, Prepared for the 31st IEEE Photovoltaic Specialists Conference and Exhibition, Lake Buena Vista, Florida, Jan. 3-7, 2005. p. 1-5.

W I Milne, Electronic devices from diamond-like carbon, Semiconductor Science and Technology, 18(2003) S81-S85.

Chang Hyun Lee and Koeng Su Lim, Carrier transport through boron-doped amorphous diamond-like carbon p layer of amorphous silicon based p-i-n solar cells, Applied Physics Letters, vol. 75 No. 4, Jul. 26, 1999 569-571.

Steven Lansel, Technology and Future of III-V Multi-Junction Solar Cells, School of Electrical and Computer Engineering, Georgia Institute of Technology, Atlanta, GA; ECE 6542 Professor Chang, Apr. 21, 2005.

M.A. Green et al., Enhanced Light-Trapping in 21.5% Efficient Thin Silicon Solar Cells, Abstract Centre for Photovoltaic Devices and Systems, University of New South Wales; Sydney Australia; p, 1-4.

Paul Preuss, An unexpected discovery could yield a full spectrum solar cell, research news www.lbl. gov/Science-Articles/Archive/MSD-full-spectrum-solar-cell.html, Berkeley, CA. Nov. 18, 2002 p. 1-5.

Dr. Chien-Min Sung, Chapter 12: Diamond Electrodes; Diamond can be the most sensitive detector with high reliability; Diamond Films and Diamond-Like Carbon; published 2003 pp. 389-399.

US 7,951,642 B2

DIAMOND-LIKE CARBON ELECTRONIC DEVICES AND METHODS OF MANUFACTURE

RELATED APPLICATIONS

This application is a divisional of U.S. patent application Ser. No. 11/893,589, filed on Aug. 14, 2007, now U.S. Pat. No. 7,745,831 which claims the benefit of U.S. Provisional Application No. 60/837,885, filed Aug. 14, 2006, each of which is incorporated herein by reference.

FIELD OF THE INVENTION

The present invention relates generally to diamond-like carbon materials, and to devices and methods that utilize conductive diamond-like carbon material. Accordingly, the present application involves the fields of physics, chemistry, electricity, and material science.

BACKGROUND OF THE INVENTION

Solar cell technologies have progressed over the past several decades resulting in significant contributions to potential power sources in many different applications. Despite dramatic improvements in materials and manufacturing methods, solar cells still have efficiency limits well below theoretical efficiencies, with current conventional solar cells having maximum efficiency of around 26%. Various approaches have attempted to increase efficiencies with some success. For example, prior approaches have included light trapping structures and buried electrodes in order to minimize surface area shaded by the conductive metal grid. Other methods have included a rear contact configuration where recombination of hole-electron pairs occurs along the rear side of the cell.

However, these and other approaches still suffer from drawbacks such as mediocre efficiencies, manufacturing complexities, material costs, reliability, and radiation degradation, among others. As such, materials capable of achieving high current outputs by absorbing relatively low amounts of energy from an energy source, and which are suitable for use in practical applications continue to be sought through ongoing research and development efforts.

SUMMARY OF THE INVENTION

Accordingly, the present invention provides materials, devices, and methods for enhancing performance of electronic devices such as solar cells, thermoelectric conversion devices and other electronic devices. In accordance with the present invention, a diamond-like carbon electronic device can include a diamond-like carbon cathode. The cathode can comprise a conductive diamond-like carbon material having an $sp^3$ bonded carbon content from about 30 atom % to about 90 atom %, a hydrogen content from 0 atom % to about 30 atom %, and an $sp^2$ bonded carbon content from about 10 atom % to about 70 atom %. A charge carrier separation layer can be coupled adjacent the diamond-like carbon cathode. Further, an anode can be adjacent the charge carrier separation layer opposite the diamond-like carbon cathode.

In another alternative aspect of the present invention, a conductive diamond-like carbon material can comprise a diamond-like carbon material having a resistivity from about 0 $\mu\Omega$-cm to about 80 $\mu\Omega$-cm at 20° C. such that the material is electrically conductive. Further, the diamond-like carbon material can have a visible light transmissivity from about 0.5 to about 1.0. The conductivity and visible light transmissivity can be a function of $sp^2$ and $sp^3$ bonded carbon content, hydrogen content, and optional conductive additives. For example, an increase in $sp^2$ bonded carbon content can increase conductivity while decreasing transmissivity. Conversely, an increase in hydrogen content and/or $sp^3$ bonded carbon content can lead to increases in transmissivity and decrease in conductivity. Conductivity and transmissivity can also be affected by introduction of additives such as dopants or conductive materials.

The conductive diamond-like carbon material of the present invention can be useful for a variety of applications such as, but not limited to, solar cell electrodes, fuel cells, LED electrodes, thermoelectric conversion devices, or any other application which can benefit from the use of conductive and transparent electrodes which are also chemically inert, radiation damage resistance, and are simple to manufacture.

In one detailed aspect of the present invention, the charge carrier separation layer can be a semiconductor layer to form a solar cell. The diamond-like carbon cathode of the present invention can allow for the semiconductor layer to be substantially planar. For example, the solar cell can be free of trenches and/or metal grid materials which are commonly present in conventional silicon solar cells. Further, the charge carrier separation layer can have a thickness from about 10 $\mu$m to about 300 $\mu$m.

In yet another detailed aspect of the present invention, the charge carrier separation layer can form a multi-junction solar cell. Alternatively, the charge carrier separation layer can include a compositionally graded material including carbon and semi-conductor.

The present invention further includes methods of forming a diamond-like carbon electronic device. A charge carrier separation layer can be prepared having desired properties and characteristics designed for a particular device. An anode can be formed adjacent the charge carrier separation layer. Further, a diamond-like carbon cathode can be formed and coupled to the charge carrier separation layer opposite the anode. Based on the following detailed discussion, the diamond-like carbon cathode can include a diamond-like carbon material having a conductivity from about 0 $\mu\Omega$-cm to about 80 $\mu\Omega$-cm at 20° C. and a visible light transmissivity from about 0.5 to about 1.0.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

Figure 1:
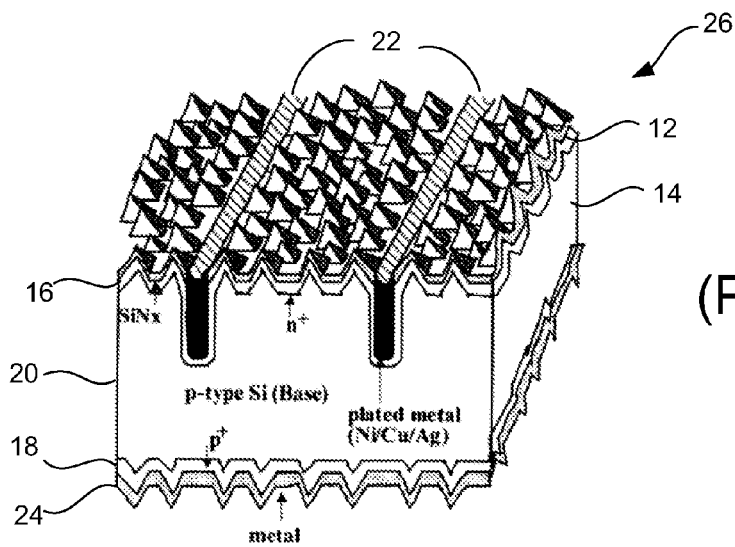
FIG. 1 shows a side cross-sectional view of a conventional silicon solar cell in accordance with the prior art.

The drawings will be described further in connection with the following detailed description. Further, these drawings are not necessarily to scale and are by way of illustration only such that dimensions and geometries can vary from those illustrated.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," "an," and "the" include plural referents unless the context clearly dictates otherwise. Thus, for example, reference to "a layer" includes one or more of such layers, reference to "an additive" includes reference to one or more of such materials, and reference to "a cathodic arc technique" includes reference to one or more of such techniques.

Definitions

In describing and claiming the present invention, the following terminology will be used in accordance with the definitions set forth below.

As used herein, "charge carrier separation layer" refers to any material or layer which provides an electric potential barrier to free electron flow. Non-limiting examples of charge carrier separation layers can include p-n junctions, p-i-n junctions, electrolyte solutions, thin film junctions (e.g. thin dielectric films), and the like. As used herein, "electrode" refers to a conductor used to make electrical contact between at least two points in a circuit.

As used herein, "$sp^3$ bonded carbon" refers to carbon atoms bonded to neighboring carbon atoms in a crystal structure substantially corresponding to the diamond isotope of carbon (i.e. pure $sp^3$ bonding), and further encompasses carbon atoms arranged in a distorted tetrahedral coordination $sp^3$ bonding, such as amorphous diamond and diamond-like carbon.

As used herein, "$sp^2$ bonded carbon" refers to carbon atoms bonded to neighboring carbon atoms in a crystal structure substantially corresponding to the graphitic isotope of carbon.

As used herein, "diamond" refers to a crystalline structure of carbon atoms bonded to other carbon atoms in a lattice of tetrahedral coordination known as $sp^3$ bonding. Specifically, each carbon atom is surrounded by and bonded to four other carbon atoms, each located on the tip of a regular tetrahedron. Further, the bond length between any two carbon atoms is 1.54 angstroms at ambient temperature conditions, and the angle between any two bonds is 109 degrees, 28 minutes, and 16 seconds although experimental results may vary slightly. The structure and nature of diamond, including many of its physical and electrical properties are well known in the art.

As used herein, "distorted tetrahedral coordination" refers to a tetrahedral bonding configuration of carbon atoms that is irregular, or has deviated from the normal tetrahedron configuration of diamond as described above. Such distortion generally results in lengthening of some bonds and shortening of others, as well as the variation of the bond angles between the bonds. Additionally, the distortion of the tetrahedron alters the characteristics and properties of the carbon to effectively lie between the characteristics of carbon bonded in $sp^3$ configuration (i.e. diamond) and carbon bonded in $sp^2$ configuration (i.e. graphite). One example of material having carbon atoms bonded in distorted tetrahedral bonding is amorphous diamond. It will be understood that many possible distorted tetrahedral configurations exist and a wide variety of distorted configurations are generally present in amorphous diamond.

As used herein, "diamond-like carbon" refers to a carbonaceous material having carbon atoms as the majority element, with a substantial amount of such carbon atoms bonded in distorted tetrahedral coordination. Diamond-like carbon (DLC) can typically be formed by PVD processes, although CVD or other processes could be used such as vapor deposition processes. Notably, a variety of other elements can be included in the DLC material as either impurities, or as dopants, including without limitation, hydrogen, sulfur, phosphorous, boron, nitrogen, silicon, tungsten, etc.

As used herein, "amorphous diamond" refers to a type of diamond-like carbon having carbon atoms as the majority element, with a substantial amount of such carbon atoms bonded in distorted tetrahedral coordination. In one aspect, the amount of carbon in the amorphous diamond can be at least about 90%, with at least about 20% of such carbon being bonded in distorted tetrahedral coordination. Amorphous diamond also has a higher atomic density than that of diamond (176 atoms/cm$^3$). Further, amorphous diamond and diamond materials contract upon melting.

As used herein, "transmissivity" refers to the portion of light which travels across a material. Transmissivity is defined as the ratio of the transmitted light intensity to the total incident light intensity and can range from 0 to 1.0.

As used herein, "vapor deposited" refers to materials which are formed using vapor deposition techniques. "Vapor deposition" refers to a process of depositing materials on a substrate through the vapor phase. Vapor deposition processes can include any process such as, but not limited to, chemical vapor deposition (CVD) and physical vapor deposition (PVD). A wide variety of variations of each vapor deposition method can be performed by those skilled in the art. Examples of vapor deposition methods include hot filament CVD, rf-CVD, laser CVD (LCVD), laser ablation, conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), and the like.

As used herein, "asperity" refers to the roughness of a surface as assessed by various characteristics of the surface anatomy. Various measurements may be used as an indicator of surface asperity, such as the height of peaks or projections thereon, and the depth of valleys or concavities depressing therein. Further, measures of asperity include the number of peaks or valleys within a given area of the surface (i.e. peak or valley density), and the distance between such peaks or valleys.

As used herein, "metallic" refers to a metal, or an alloy of two or more metals. A wide variety of metallic materials are known to those skilled in the art, such as aluminum, copper, chromium, iron, steel, stainless steel, titanium, tungsten, zinc, zirconium, molybdenum, etc., including alloys and compounds thereof.

As used herein, "dielectric" refers to any material which is electrically resistive. Dielectric materials can include any number of types of materials such as, but not limited to, glass, polymers, ceramics, graphites, alkaline and alkali earth metal salts, and combinations or composites thereof.

As used herein, "vacuum" refers to a pressure condition of less than $10^{-2}$ torr.

As used herein, "electrically coupled" refers to a relationship between structures that allows electrical current to flow at least partially between them. This definition is intended to include aspects where the structures are in physical contact and those aspects where the structures are not in physical contact. Typically, two materials which are electrically coupled can have an electrical potential or actual current between the two materials. For example, two plates physically connected together by a resistor are in physical contact, and thus allow electrical current to flow between them. Conversely, two plates separated by a dielectric material are not in physical contact, but, when connected to an alternating current source, allow electrical current to flow between them by capacitive means. Moreover, depending on the insulative nature of the dielectric material, electrons may be allowed to bore through, or jump across the dielectric material when enough energy is applied.

As used herein, "adjacent" refers to near or close sufficient to achieve a desired affect. Although direct physical contact is most common and preferred in the layers of the present invention, adjacent can broadly allow for spaced apart features.

As used herein, "thermoelectric conversion" relates to the conversion of thermal energy to electrical energy or of electrical energy to thermal energy, or flow of thermal energy.

As used herein, the term "substantially" refers to the complete or nearly complete extent or degree of an action, characteristic, property, state, structure, item, or result. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect on the property of interest thereof.

As used herein, the term "about" is used to provide flexibility to a numerical range endpoint by providing that a given value may be "a little above" or "a little below" the endpoint with a degree of flexibility as would be generally recognized by those skilled in the art. Further, the term about explicitly includes the exact endpoint, unless specifically stated otherwise.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually. This same principle applies to ranges reciting only one numerical value as a minimum or a maximum. Furthermore, such an interpretation should apply regardless of the breadth of the range or the characteristics being described.

The Invention

FIG. 1 illustrates a conventional crystalline silicon solar cell 10 in accordance with the prior art. An anti-reflection layer 12 is used to prevent excessive reflection of light from the surface of the underlying silicon layer 14. The anti-reflection layer is most often silicon nitride, although other materials have also been used, and is electrically insulating. The silicon solar cell shown in FIG. 1 is commonly referred to as a p-i-n solar cell due to the respective n and p doping of cathode area 16 and anode area 18 on either side of an insulating inner layer 20. A conductive metal grid 22 is buried into the silicon layer. The metal grid is typically formed of silver which is sintered at about 800° C. or other conductive metals like copper or nickel. The metal grid is embedded a significant distance into the insulating layer, e.g. typically over about 400 to 500 µm. A conductive metal such as silver or other suitable material is also used as the anode 24. Although many other considerations are important in designing solar cells, such are well within the knowledge of one skilled in the art. Further, the above description provides a suitable background for the following discussion of various aspects of the present invention and the contribution thereof to the art.

In one aspect of the present invention, a diamond-like carbon electronic device may include a conductive diamond-like carbon cathode, a charge carrier separation layer adjacent the diamond-like carbon cathode, and an anode adjacent the charge carrier separation layer opposite the diamond-like carbon cathode. Another aspect of the present invention can include a diamond-like carbon material having a resistivity from about 0 µΩ-cm to about 80 µΩ-cm at 20° C. such that the material is electrically conductive. In another aspect the resistivity of the conductive diamond-like carbon material can be from about 0 µΩ-cm to about 40 µΩ-cm. Further, the diamond-like carbon material can have a visible light transmissivity from about 0.5 to about 1.0. The conductivity and visible light transmissivity can be a function of $sp^2$ and $sp^3$ bonded carbon content, hydrogen content, and optional conductive additives. For example, an increase in $sp^2$ bonded carbon content can increase conductivity while decreasing transmissivity. Conversely, an increase in hydrogen content and/or $sp^3$ bonded carbon content can lead to increases in transmissivity and decrease in conductivity. Conductivity and transmissivity can also be affected by introduction of additives such as dopants or conductive materials.

The conductive diamond-like carbon material of the present invention can be useful for a variety of applications such as, but not limited to, solar cell electrodes, LED electrodes, or other applications where conductive and transparent electrodes which are also chemically inert, radiation damage resistant, and are simple to manufacture.

In accordance with one embodiment of the present invention, a diamond-like carbon electronic device can include a diamond-like carbon cathode. The cathode can comprise a conductive diamond-like carbon material having an $sp^3$ bonded carbon content from about 30 atom % to about 90 atom %, a hydrogen content from 0 atom % to about 30 atom %, and an $sp^2$ bonded carbon content from about 10 atom % to about 70 atom %. A charge carrier separation layer can be coupled adjacent the diamond-like carbon cathode. Further, an anode can be adjacent the charge carrier separation layer opposite the diamond-like carbon cathode. It should be noted that the terms "cathode" and "anode" are intended to be interchangeable, and are used to merely signify a difference in polarity between two electrodes. For example, applications using alternating current would involve electrodes which serve as both anode and cathode.

Figure 2:
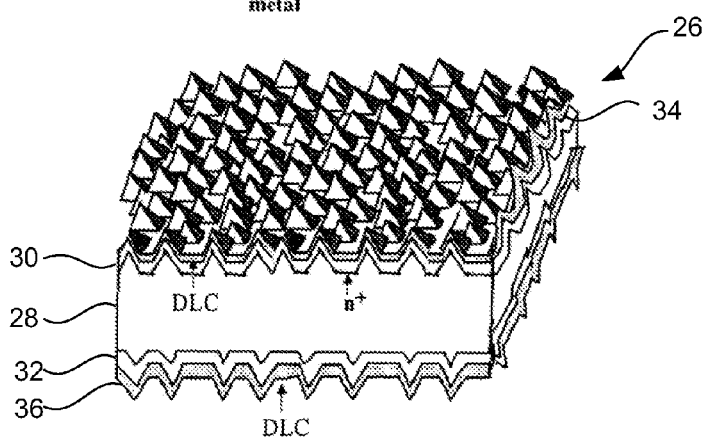
FIG. 2 shows a side cross-sectional view of a diamond-like carbon composite solar cell in accordance with one embodiment of the present invention.

Referring now to FIG. 2, the diamond-like carbon electronic device can be a solar cell 26. In this embodiment of the present invention, the charge carrier separation layer can be a semiconductor layer 28 adjacent an anode 36. The semiconductor layer can be formed of any suitable material such as, but not limited to, crystalline silicon, amorphous silicon, gallium arsenide, gallium indium phosphide, gallium indium nitride, copper indium diselenide, cadmium telluride, and composites or combinations thereof. In one embodiment of the present invention, the charge carrier separation layer can comprise crystalline silicon. In some cases, the charge carrier separation layer can consist essentially of crystalline silicon, with the exception of suitable dopants. In another preferred embodiment, the charge carrier separation layer can comprise or consist essentially of amorphous silicon, again with the exception of suitable dopants. Crystalline-based charge carrier separation layers can be particularly used in formation of solar cells. In contrast, a partially or fully amorphous charge separation carrier layer can be particularly useful in thermoelectric conversion devices, e.g. those which convert heat into electricity.

Suitable charge separation carrier layers can be formed using a variety of methods such as, but not limited to, vapor deposition, epitaxial growth or the like. Most often, a starting material such as a conventional silicon wafer can be used from conventional commercial sources. The wafer can be cut from a solid silicon ingot or boule. The wafer can be polished to have a smooth surface. Alternatively, the semiconductor material can be formed directly on a desired substrate or anode using vapor deposition or other suitable techniques. Further, the wafer or semiconductor surface can be etched to roughen the surface and/or may include features such as pyramidal depressions or extensions which increase functional surface areas of the device. These features can be varied in size and geometry based on balancing performance, cost, and material limitations. For example, etching of pyramidal extensions or depressions can be particularly useful in enhancing performance. Such extension and depressions are most often from about 0.01 mm to about 0.7 mm, although other dimensions can be useful.

Generally, the present invention also provides methods for forming diamond-like carbon electronic devices. Such a method may include forming an anode on a suitable charge carrier separation layer and coupling a conductive diamond-like carbon cathode to the charge carrier separation layer opposite the anode. The conductive diamond-like carbon cathode may be formed on the charge carrier separation layer opposite the anode, or it may be formed separately therefrom and subsequently coupled thereto as described in more detail throughout. Additionally, in one aspect the anode may be a conductive diamond-like carbon anode.

The diamond-like carbon electronic devices of the present invention allow for a significant reduction in the thickness of the charge carrier separation layer. At least one reason for this is the elimination or reduction of any buried metal grid electrodes. The diamond-like carbon cathode of the present invention can allow for the semiconductor layer to be substantially planar. For example, the devices of the present invention can be free of trenches and/or metal grid materials which are present in conventional silicon solar cells. As a general guideline, the charge carrier separation layer of the present invention can have a thickness from about 10 μm to about 300 μm, and preferably from about 50 μm to about 150 μm, with about 100 μm being currently most preferred. The use of conductive diamond-like carbon material can also prevent these thinner semiconductor layers from warping.

The charge carrier separation layer can most often be configured as a p-i-n or p-n junction. For example, FIG. 2 illustrates a p-i-n junction where the charge carrier separation layer comprises a semiconductor layer which is doped on each side with either p- or n-doping materials. An n-doped area 30 can be formed by conventional doping of the semiconductor layer 28. Suitable n-dopants can include, but are not limited to, phosphorous, arsenic, bismuth, antimony, and combinations thereof. Similarly, a p-doped area 32 can be formed by doping of the semiconductor layer with dopants such as, but not limited to, boron, aluminum, gallium, indium, thallium, and combinations thereof. The degree of doping can be controlled by the conditions during doping such as dopant concentration, temperature, and the like. The charge carrier separation layer can alternatively be formed of distinct layers in a p-n configuration. Specifically, an n-doped semiconductor layer can be formed adjacent a p-doped semiconductor layer to form the charge carrier separation layer. The semiconductor materials can be selectively doped using methods such as, but not limited to, ion implantation, drive-in diffusion, field-effect doping, electrochemical doping, vapor deposition, or the like. Further, such doping can be accomplished by co-deposition with the semiconductor material. For example, a boron source gas and silicon or other semiconductor source gas can be simultaneously present in a vapor deposition chamber.

The diamond-like carbon electronic device of the present invention can include a cathode 34 comprising a conductive diamond-like carbon material. The conductive diamond-like carbon material of the present invention represents a distinct class of diamond-like carbon materials having the properties identified herein such as low resistivity, high transmissivity, etc. As mentioned earlier, these properties are at least partially related to variables such as hydrogen content, $sp^2$ and $sp^3$ bonded carbon content, and optional additives or dopants. Most often, the conductive diamond-like material can be formed on the semiconductor layer by a suitable vapor deposition process. Additionally, in one specific embodiment, the diamond-like carbon material may be amorphous diamond.

Increased hydrogen content can contribute to an increase in transmissivity. The hydrogen content can be incorporated throughout the conductive diamond-like material or substantially only at a surface thereof. In one embodiment, any hydrogen content can be substantially only at external surfaces of the conductive diamond-like material. As a general guideline, in one specific embodiment the hydrogen content can range from 0 atom % to about 30 atom %. In another specific embodiment the hydrogen content can range from about 15 atom % to about 25 atom %. In one alternative embodiment, the conductive diamond-like carbon can be substantially free of hydrogen content. However, hydrogen content can be increased by increasing hydrogen gas concentrations during deposition of the diamond-like carbon material. Alternatively, a diamond-like carbon material can be heat treated with hydrogen gas to form a hydrogen terminated surface layer of diamond-like carbon. Typically, deposition occurs using a vapor deposition process such as chemical vapor deposition, although other methods can be suitable.

Increased hydrogen content can also be accompanied by decreased conductivity, all other variables being factored out. Therefore, it can sometimes be desirable to introduce a conductive additive in relatively small amounts to increased conductivity. Suitable conductive additives can be incorporated via any number of approaches such as, but not limited to, codeposition in the vapor phase, coating of the conductive additives by the diamond-like carbon material, infiltration, alternating deposition of each material, and the like. Suitable conductive additives can include conductive metal particulates incorporated into a hydrogenated diamond-like carbon material. Suitable metal particles can comprise metals such as silver, copper, gold, titanium, or other similar materials. In one specific aspect, the metal particles can be nanoparticles, i.e. 100 nm or less and often 50 nm or less. Other conductive additives can include, but are not limited to, carbon nanotubes, graphite, and the like. In one particular scenario, the conductive additive can be a graphite having a degree of graphitization greater than 0.8 and often greater than 0.9. Further, in order to avoid excessive decrease in transmissivity due to the conductive additives the size and/or the concentration of the additives can be decreased. Such particulates can be any suitable size, although about 1 nm to about 1 µm is typically suitable with about 2 nm to about 100 nm being suitable and about 0.1 µm to about 0.6 µm being preferred. Smaller particle sizes allow for increased transmissivity but also experience a contrasting decrease in contribution to conductivity of the diamond-like material. Similarly, concentration of metal additives can generally range from about 2 vol % to about 60 vol %, although optimal particle sizes and concentrations can vary considerably depending on the specific particle material, $sp^2$ and $sp^3$ bonded carbon content, and hydrogen content. These same principles can be equally applied to the anode side of the device.

Another important variable with respect to the conductive diamond-like carbon material is the $sp^3$ bonded carbon content. Advantageously, an increase in $sp^3$ bonded carbon content results in an increase in transmissivity as the diamond character of the material increase. However, this is also accompanied by an associated decrease in conductivity. Generally, the conductive diamond-like carbon material, whether at the cathode and/or anode can have an $sp^3$ bonded carbon content from about 30 atom % to about 90 atom %. At higher $sp^3$ bonded carbon contents, e.g. from about 50 atom % to about 90 atom %, additional additives and/or dopants can be introduced to increase conductivity sufficient for use of the material as a conductive electrode within the device. For example, doping with nitrogen or other similar dopants can provide good results without significantly decreasing transmissivity in the case of use in the cathode.

Further, $sp^2$ bonded carbon content can also contribute to decreased transmissivity. However, $sp^2$ bonded carbon is graphitic in crystal structure and is electrically conductive. Therefore, an appropriate balance of $sp^2$ bonded carbon content should be considered. As a general guideline, in one embodiment the conductive diamond-like carbon material can have from about 10 atom % to about 70 atom % $sp^2$ bonded carbon content. In another embodiment, the conductive diamond-like carbon material can have from about 35 atom % to about 60 atom %. However, the specific content can depend on the hydrogen content, $sp^3$ bonded carbon content, and other optional additives and/or dopants. However, the $sp^2$ bonded carbon content can preferably be sufficient to provide the conductive diamond-like carbon material with a visible light transmissivity of greater than about 0.70, and most preferably greater than about 0.90.

The diamond-like carbon material can be made using any suitable method, such as various vapor deposition processes. In one aspect of the invention, the diamond-like carbon material can be formed using a cathodic arc method. Various cathodic arc processes are well known to those of ordinary skill in the art, such as those disclosed in U.S. Pat. Nos. 4,448,799; 4,511,593; 4,556,471; 4,620,913; 4,622,452; 5,294,322; 5,458,754; and 6,139,964, each of which is incorporated herein by reference. Generally speaking, cathodic arc techniques involve the physical vapor deposition (PVD) of carbon atoms onto a target, or substrate. The arc is generated by passing a large current through a graphite electrode that serves as an anode, and vaporizing carbon atoms with the current. If the carbon atoms contain a sufficient amount of energy (i.e. about 100 eV) they will impinge on the target and adhere to its surface to form a carbonaceous material, such as amorphous diamond. Amorphous diamond can be coated on almost any metallic substrate, typically with no, or substantially reduced, contact resistance. In general, the kinetic energy of the impinging carbon atoms can be adjusted by the varying the negative bias at the substrate and the deposition rate can be controlled by the arc current. Control of these parameters as well as others can also adjust the degree of distortion of the carbon atom tetrahedral coordination and the geometry, or configuration of the amorphous diamond material (i.e. for example, a high negative bias can accelerate carbon atoms and increase $sp^3$ bonding). By measuring the Raman spectra of the material the $sp^3/sp^2$ ratio can be determined. However, it should be kept in mind that the distorted tetrahedral portions of the amorphous diamond layer are generally neither pure $sp^3$ nor $sp^2$ but a range of bonds which are of intermediate character. Further, increasing the arc current can increase the rate of target bombardment with high flux carbon ions. As a result, temperature can rise so that the deposited carbon will convert to more stable graphite. Thus, final configuration and composition (i.e. band gaps, NEA, and emission surface asperity) of the diamond-like carbon material can be controlled by manipulating the cathodic arc conditions under which the material is formed.

Additionally, other processes can be used to form diamond-like carbon such as various vapor deposition processes, e.g. chemical vapor deposition or the like. In preparing more crystalline diamond-like carbon, chemical vapor deposition can be used. Chemical vapor deposition (CVD) of diamond-like carbon can generally be performed by introducing a carbon source gas at elevated temperatures into a chamber housing a deposition substrate, e.g. semiconductor or charge separation carrier layer. Diamond-like carbon is typically deposited using physical vapor deposition (PVD) which involves impinging carbon atoms against a substrate at relatively low deposition and plasma temperatures (e.g. 100° C.). Due to the low temperature of such PVD methods, carbon atoms are not located at thermal equilibrium positions. As a result, the film can be less stable with high internal stress. Alternatively, CVD processes can be employed to deposit diamond-like carbon. If the deposition temperature is high (e.g. 800° C.), diamond will grow to become a crystalline CVD diamond film. An example of a suitable CVD process is radio frequency (13.6 MHz) CVD by dissociation of acetylene ($C_2H_2$) and hydrogen gas under partial vacuum (millitorr). Alternatively, pulsed DC can be used in stead of RF CVD. In the case of amorphous diamond, deposition by cathodic arc or laser ablation can form a suitable layer. Conductive diamond-like carbon material can be used as the cathode and optionally also as the anode of devices of the present invention.

The formation of the cathode and/or anode may be further facilitated through the deposition of a conformal diamond-like carbon layer. Conformal diamond coating processes can provide a number of advantages over conventional diamond film processes. Conformal diamond coating can be performed on a wide variety of substrates, including non-planar substrates. A growth surface can be pretreated under diamond growth conditions in the absence of a bias to form a carbon film. The diamond growth conditions can be conditions which are conventional vapor deposition conditions for diamond without an applied bias. As a result, a thin carbon film can be formed which is typically less than about 100 angstroms. The pretreatment step can be performed at almost any growth temperature such as from about 200° C. to about 900° C., although lower temperatures below about 500° C. may be preferred. Without being bound to any particular theory, the thin carbon film appears to form within a short time, e.g., less than one hour, and is a hydrogen terminated amorphous carbon.

Following formation of the thin carbon film, the growth surface may then be subjected to diamond growth conditions to form the diamond-like carbon layer. The diamond growth conditions may be those conditions which are commonly used in traditional vapor deposition diamond growth. However, unlike conventional amorphous diamond film growth, an amorphous diamond film produced using the above pretreatment steps results in a conformal amorphous diamond film that typically begins growth substantially over the entire growth surface with substantially no incubation time.

One aspect of the diamond-like carbon material that facilitates electron emission is the distorted tetrahedral coordination with which many of the carbon atoms are bonded. Tetrahedral coordination allows carbon atoms to retain the $sp^3$ bonding characteristic that provides a plurality of effective band gaps, due to the differing bond lengths of the carbon atom bonds in the distorted tetrahedral configuration.

Figure 4:
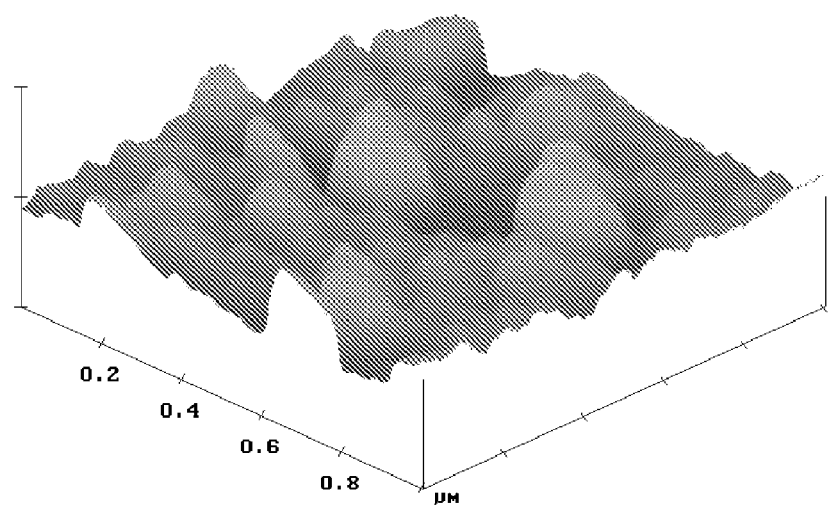
FIG. 4 shows an SEM graph of amorphous diamond material illustrating the variation in asperity size and shape.

In one aspect of the present invention, the upper exposed surface of the electronic device can be configured to improve energy absorption. Specifically, as shown in FIG. 2, the surface area of the outer layer can be increased by forming features which extend outwardly such as the pyramids shown. However, other shaped features can be suitable for use in the present invention. This not only increases surface area for exposure to light or other energy sources, but also provides an increased junction surface area per total area of the device. Further, the diamond-like carbon material can have a surface roughness which further increases the surface area on a much smaller scale than illustrated and than the pyramid features. FIG. 4 is a micrograph of a diamond-like carbon material suitable for use in the present invention illustrating random asperities of typical amorphous diamond. The features can typically have dimensions in the tens of microns range, while the diamond-like carbon material can have asperities in the nanometer range. In one aspect, the diamond-like carbon material can have an average surface asperity having a height of from about 10 to about 10,000 nanometers. In another aspect, the diamond-like carbon material can have an average asperity height of from about 10 to about 1,000 nanometers. In yet another aspect, the average asperity height can be about 800 nanometers. In a further aspect, the average asperity height can be about 100 nanometers. Further, in one aspect the asperity can have an average peak density of at least about 1 million peaks per square centimeter of emission surface. In another aspect, the average peak density can be at least about 100 million peaks per square centimeter of the surface. In yet another aspect, the peak density can be at least about 1 billion peaks per square centimeter of the surface. In a further aspect, the average asperity can include a height of about 800 nanometers and a peak density of at least about, or greater than about 1 million peaks per square centimeter of emission surface. In yet a further aspect, the asperity can include a height of about 1,000 nanometers and a peak density of at least about, or greater than 1 billion peaks per square centimeter of the surface.

Figure 5:
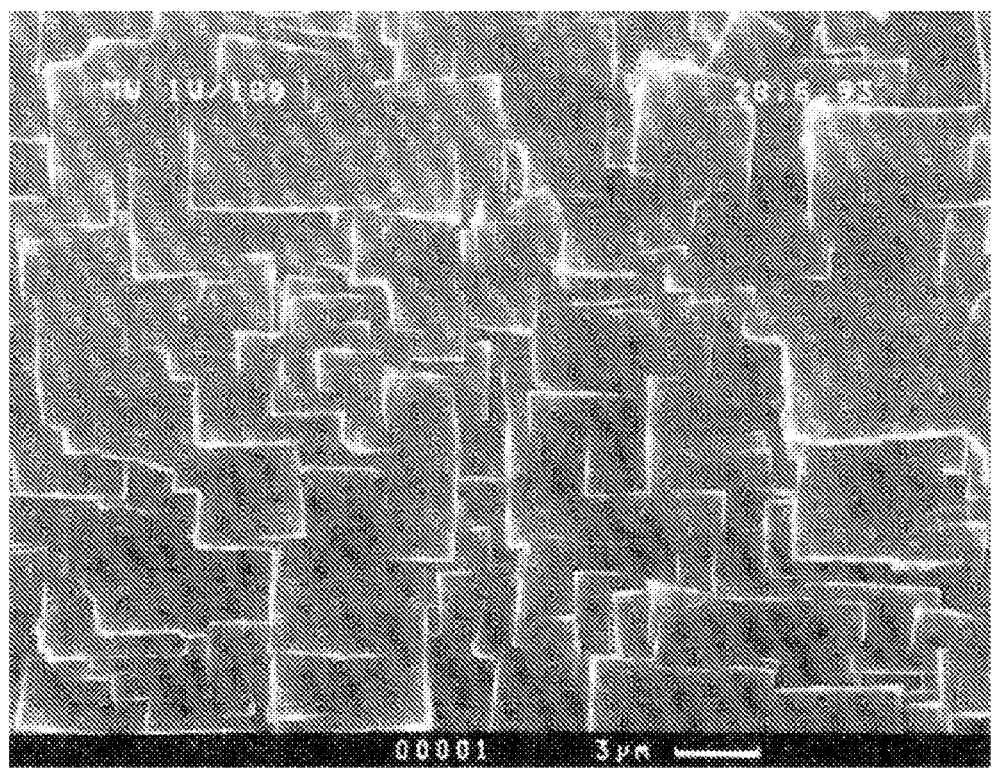
FIG. 5 is a micrograph of a mosaic surface of a diamond-like carbon material grown heteroepitaxially on a silicon substrate in accordance with one aspect of the present invention.

Further, the diamond-like carbon material can be grown as a polycrystalline film on a silicon substrate, preferably the (100) face of a silicon wafer. By orienting the nuclei, forming crystallographically oriented pits, and/or minimizing the growth rate, the multiple grains can merge to form a mosaic structure having similar orientations such that the overall crystal structure is intermediate between single crystalline, which can be difficult to achieve, and polycrystalline. FIG. 5 is a micrograph of such a mosaic structure of diamond-like carbon grown hetero-epitaxially on a 100 face of silicon.

As noted above, various dopants can enhance or control the conductivity of the conductive diamond-like carbon materials of the present invention. Most often suitable dopants can include B, N, Si, P, Li, conductive metal, or combinations thereof, although other materials can also be effective. Boron doped diamond-like carbon materials can be highly transmissive and is also conductive. For example, hydrogenated boron doped diamond-like carbon material can be formed using a radio frequency chemical vapor deposition process including a carbon source gas and a boron source gas. Non-limiting examples of carbon sources gases can include methane and ethylene. Similarly, non-limiting examples of boron source gases can include $BH_3$ and $B_2H_2$, although other boron gases can be used. This hydrogenated boron doped diamond material and other diamond-like materials of the present invention can serve as a conductive layer, passivation layer, and an anti-reflection layer. Thus, a conventional SiN anti-reflection layer can be eliminated. Similarly, passivation steps and techniques can be reduced or entirely eliminated. The diamond-like carbon material can enhance resistance to mechanical scratching and chemical corrosion. Further, an optional metal material can be added during formation of the boron doped diamond-like carbon material. For example, a silver or other metal vapor can also be introduced during vapor deposition.

Additionally, excessive grain boundaries within the conductive diamond-like carbon material can increase resistivity of the material. Grain boundaries can be minimized using a variety of techniques. In one currently preferred approach, formation of the diamond-like carbon material can be initiated using nanodiamond seeding. Alternatively, high temperature annealing of the diamond-like carbon material can help to reduce grain boundaries somewhat. Further, surface roughness of the conductive diamond-like carbon material can be less than about 30 nm. This can be accomplished using a suitable technique. For example, reverse casting using a smooth inverse mold, polishing, or other similar processes can be used. In yet another alternative aspect of the present invention, the semiconductor layer can be prepared by etching to roughen the n-doped surface of the semiconductor. This can enhance diamond-like carbon grain growth and further increase electron flow into the diamond-like carbon material layer.

In accordance with the present invention, an electronic device can include a diamond-like carbon electronic cathode which consists essentially of the conductive diamond-like carbon. This is particularly useful in the context of forming solar cells. In this manner, the solar cell cathode can exclude any metal grids or other materials which contribute to decreases in transmissivity. Conventional metal leads can be formed around the periphery of the diamond-like carbon cathode which can be used to integrate the electronic device as part of a complete circuit. Alternatively, or in addition, the cathode can be formed by depositing diamond-like carbon on a metallic layer such as silver grease or other suitable conductive layer.

The conductive diamond-like carbon cathode or anode of the present invention can have any functional thickness. However, the cathode can typically have a thickness from about 0.01 μm to about 10 μm. Thus, the overall device can, in some embodiments, measure from about 10 μm to about 350 μm, and in some cases from about 50 μm to about 150 μm.

Further, the anode can be formed of any suitable conductive material. Non-limiting examples of suitable conductive materials can include silver, gold, tin, copper, aluminum, and alloys thereof. Alternatively, at least a portion of the anode can be formed of a conductive diamond-like carbon material. Although the same parameters can be used as described above, transmissivity of the anode is often less important. Therefore, a higher $sp^2$ carbon bonded content can be tolerated than for the cathode side without the need for additives or dopants.

In another embodiment of the present invention, the charge carrier separation layer can serve as one or more portions of a p-n or p-i-n junction. For example, the charge carrier separation layer can be p-doped while the conductive diamond-like carbon cathode can be n-doped in a region adjacent the charge carrier separation layer, as previously discussed. Thus, the charge carrier separation layer would serve only as a single portion of the junction. Similarly, the conductive diamond-like carbon cathode can include multiple regions, e.g. a conductive electrode region remote or opposite from the charge carrier separation layer and an n-doped region proximate to the charge carrier separation layer.

In yet another detailed aspect of the present invention, the charge carrier separation layer can form a multi-junction solar cell. Multiple junctions can be configured having a variation in bandgaps. Typically, a single junction is capable of absorbing light corresponding to a specific bandgap for the materials comprising the junction. By preparing and configuring multiple junctions in series across the device each junction can have a different bandgap. As a result, a larger percentage of incoming energy can be converted to useful work, e.g. electricity. The higher bandgap materials can be placed above, i.e. closer to the cathode and light entry side, the lower bandgap materials. The charge carrier separation layer can be multiple p-n and/or p-i-n junctions to form a multi junction solar cell. The bandgap of each layer can be adjusted by varying dopant concentration, type and/or semiconductor material, e.g. silicon, gallium-based materials, or the like. In order to fully take advantage of the multiple junctions, the thickness is often maintained sufficiently thin to allow at least some light to pass through each layer and the layers can be formed of light transmissive materials as discussed elsewhere.

Alternatively, the charge carrier separation layer can include a compositionally graded material including carbon and semi-conductor. This approach has the added advantage of reducing thermal mismatch stresses between adjacent layers or by eliminating distinct layers altogether. The charge carrier separation layer can comprise a compositionally graded material of carbon and a semi-conductor. For example, the charge carrier separation layer can be graded from pure Si to SiC (e.g. in distinct layers of 10/20/30/40/50% Si or by a continuous gradation of materials) with a SiC layer adjacent the conductive diamond-like carbon material of the cathode. Optionally, each layer can be progressively doped having higher bandgaps with higher carbon content. Compositional differences can be achieved, for example, by varying gas source concentrations or by varying impact energy on corresponding sputtering targets.

In one aspect of the present invention, the graded material can include at least four distinct compositionally graded layers. Typically, from four to about ten graded layers and preferably four to about six layers can be formed. Alternatively, full spectrum solar cells utilizing indium gallium nitride may also be suitable in connection with the present invention.

As an additional benefit of the present invention, each of the cathode, anode and charge carrier separation layers can be formed or prepared at a temperature below about 750° C., and preferably below about 650° C. Such low temperature processing can prevent or significantly reduce warpage. Additionally, amorphous diamond has a high radiation hardness such that it is resistant to aging and degradation over time. In contrast, typical semiconductor materials are UV degradable and tend to become less reliable over time. The use of amorphous or diamond-like carbon material has the further advantage of reducing thermal mismatch between layers of the device. For example, silicon, silicon carbide and diamond-like carbon have a thermal expansion coefficient of around 4 ppm/° C. (near the process temperatures used herein) which dramatically reduces thermal mismatch stress during and after processing. This affect also reduces delamination as substantially all of the layers of the device can have substantially similar thermal expansion properties such that during thermal cycling and extended use, interfaces between layers retain interfacial strength. Solar cells formed in accordance with the present invention can have conversion efficiencies from about 18% to about 25%, although further improved performances may be obtained by judicious optimization and choice of materials based on the teachings herein. For example, graded and/or multi-junction embodiments can potentially realize efficiencies of up to about 10%, over conventional silicon solar cell efficiencies which are currently about 15-18%.

Current silicon semiconductor based solar cells (single crystal and polycrystalline) typically include a deep buried grid of silver on the light absorption side and a full faced aluminum layer intercepted by deep buried grid of silver on the back side. As the silicon layer becomes thinner, the processing temperature (e.g. 800° C.) for sintering silver powder to form a continuous mass and to diffuse silver across the anti-reflection layer on the top, and aluminum layer on back can cause warping. This is a result of the thermal expansion coefficient of silicon being much lower than that of silver or aluminum. However the CTE of diamond-like carbon can be matched to that of silicon when the conductive diamond-like carbon replaces aluminum. Because aluminum generally covers the entire back side of the silicon layer, the conductive diamond-like carbon does not distort the thin silicon layer. Specifically, the silicon or semiconductor layer is not processed at a conventional high temperature, e.g. around 800° C. Further, diamond-like carbon can form an excellent ohmic contact with silicon such that additional coating of silver does not require a high temperature sintering of silver whereas only low temperature sintering is needed, e.g. less than about 300° C.

Further, solar cells formed in accordance with the present invention can also include dye-sensitization such as by using dye-sensitized metal oxides and/or a layer of spectral sensitizing dye on a metal oxide semiconductor layer in accordance with known dye sensitized solar cell technologies. In yet another aspect of the present invention, the diamond-like carbon electronic device can be configured as a fuel cell.

Further, the entire diamond-like carbon electronic device can be a solid assembly having each layer in continuous intimate contact with adjacent layers and/or members. The above-recited components can take a variety of configurations and be made from a variety of materials. Each of the layers can be formed using any number of known techniques such as, but not limited to, vapor deposition, thin film deposition, preformed solids, powdered layers, screen printing, or the like. In one aspect, each layer is formed using vapor deposition techniques such as PVD, CVD, or any other known thin-film deposition process. In one aspect, the PVD process is sputtering or cathodic arc.

Those of ordinary skill in the art will readily recognize other components that can, or should, be added to the assembly of FIG. 2 in order to achieve a specific purpose, or make a particular device. By way of example, without limitation, a connecting line can be placed between the anode and the cathode to form a complete circuit and allow electricity to pass that can be used to power one or more devices (not shown), or perform other work.

In an optional step, the diamond-like carbon electronic devices can be heat treated in a vacuum furnace. Heat treatment can improve the thermal and electrical properties across the boundaries between different materials. The diamond-like carbon electronic device can be subjected to a heat treatment to consolidate interfacial boundaries and reduce material defects. Typical heat treatment temperatures can range from about 200° C. to about 800° C. and more preferably from about 350° C. to about 500° C. depending on the specific materials chosen.

The following are examples illustrate various methods of making electronic devices in accordance with the present invention. However, it is to be understood that the following are only exemplary or illustrative of the application of the principles of the present invention. Numerous modifications and alternative compositions, methods, and is systems can be devised by those skilled in the art without departing from the spirit and scope of the present invention. The appended claims are intended to cover such modifications and arrangements. Thus, while the present invention has been described above with particularity, the following Examples provide further detail in connection with several specific embodiments of the invention.

EXAMPLE 1

Figure 3:
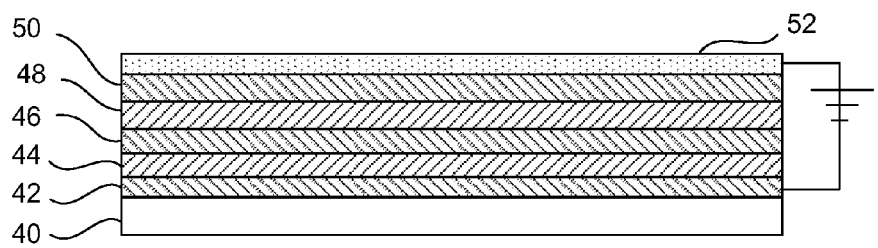
FIG. 3 shows a side cross-sectional view of a compositionally graded diamond-like carbon composite solar cell in accordance with another embodiment of the present invention.

FIG. 3 illustrates a graded solar cell in accordance with the present invention. A chemical vapor deposition silicon film 40 of about 10 μm having micron grains serves as the photoelectric substrate. The silicon film is coated successively with silicon-carbon layers via chemical vapor deposition. Layers 42, 44, 46, 48 and 50 have a Si:C ratio of 10:90, 20:80, 30:70, 40:60 and 50:50 (SiC), respectively. Each layer is doped such that the graded portion represents a single p-n junction. A conductive diamond-like carbon film 52 having a thickness of about 10 μm is deposited on the SiC layer 50. The diamond-like carbon is deposited at partial vacuum of acetylene gas and 13.6 MHz to form the conductive diamond-like carbon which is also light transmissive. The resulting solar cell has layers having bandgaps from 1.1 eV for silicon to 3.3 eV for silicon carbide which covers most visible light, e.g. red about 1 eV while blue is about 3 eV.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of forming a diamond-like carbon electronic device, comprising:
   a) preparing a charge carrier separation layer;
   b) forming an anode, said anode being coupled adjacent the charge carrier separation layer;
   c) forming a diamond-like carbon cathode coupled to the charge carrier separation layer opposite the anode, said diamond-like carbon cathode including a diamond-like carbon material having a conductivity from about 0 μΩ-cm to about 80 μΩ-cm at 20° C. and a visible light transmissivity from about 0.5 to about 1.0, said conductivity and visible light transmissivity being a function of $sp^2$ and $sp^3$ bonded carbon content, hydrogen content, and optional conductive additives.

2. The method of claim 1, wherein the step of preparing the charge carrier separation layer includes doping a semiconductor material to form at least a portion of a p-n or p-i-n junction.

3. The method of claim 2, further comprising doping the diamond-like carbon cathode to form an n-doped region.

4. The method of claim 1, wherein the step of forming the anode includes a vapor deposition process.

5. The method of claim 1, wherein each of the steps of preparing, forming the anode and forming the diamond-like carbon cathode occur at a temperature below about 750° C.

6. The method of claim 1, wherein the amorphous charge carrier separation layer is crystalline silicon.

7. The method of claim 1, wherein coupling the conductive diamond-like carbon cathode further includes forming the conductive diamond-like carbon cathode on the charge carrier separation layer opposite the anode.

8. The method of claim 1, wherein the anode is a conductive diamond-like carbon anode.

9. The method of claim 1, wherein the conductive diamond-like carbon cathode has a conductivity from about 0 μΩ-cm to about 80 μΩ-cm at 20° C. and a visible light transmissivity from about 0.5 to about 1.0, said conductivity and visible light transmissivity being a function of $sp^2$ and $sp^3$ bonded carbon content, hydrogen content, and optional conductive additives.

10. The method of claim 1, wherein the method is substantially free of a separate passivating step.

* * * * *